(12) United States Patent
Chen et al.

(10) Patent No.: US 7,820,233 B2
(45) Date of Patent: Oct. 26, 2010

(54) METHOD FOR FABRICATING A FLIP CHIP SUBSTRATE STRUCTURE

(75) Inventors: Bo-Wei Chen, Hsinchu (TW);
Hsien-Shou Wang, Hsinchu (TW);
Shih-Ping Hsu, Hsinchu (TW)

(73) Assignee: Unimicron Technology Corp. (TW)

( * ) Notice: Subject to any disclaimer, the term of this patent is extended or adjusted under 35 U.S.C. 154(b) by 1064 days.

(21) Appl. No.: 11/527,632

(22) Filed: Sep. 27, 2006

(65) Prior Publication Data
US 2008/0075836 A1 Mar. 27, 2008

(51) Int. Cl.
*B05D 5/12* (2006.01)
(52) U.S. Cl. .................. 427/97.1; 427/98.4; 427/282
(58) Field of Classification Search .......... 427/97.1, 427/98.4, 282
See application file for complete search history.

(56) References Cited

U.S. PATENT DOCUMENTS 5,985,765 A * 11/1999 Hsiao et al. .......... 438/694
6,649,490 B1 * 11/2003 Lee et al. .............. 438/445
6,846,725 B2 * 1/2005 Nagarajan et al. ....... 438/456

* cited by examiner

Primary Examiner—Brian K Talbot
(74) Attorney, Agent, or Firm—Bacon & Thomas, PLLC

(57) ABSTRACT

The present invention relates to a method to fabricate a flip chip substrate structure, which comprises: providing a carrier; forming a patterned resist layer on the surface of the carrier; forming sequentially a first metal layer, an etching-stop layer, and a second metal layer; removing the resist layer, forming a patterned first solder mask, and then forming at least one first circuit build up structure thereon; forming additionally a patterned second solder mask on the circuit build up structure; respectively removing the carrier, the first metal layer, and the etching-stop layer; and forming solder bumps on both sides of the circuit build up structure. The method increases integration and achieves the purpose of miniaturization. The method solves the problem of circuit layer multiplicity and process complexity.

26 Claims, 17 Drawing Sheets

METHOD FOR FABRICATING A FLIP CHIP SUBSTRATE STRUCTURE

BACKGROUND OF THE INVENTION

1. Field of the Invention

The present invention relates to a flip chip structure, the method to manufacture the same and, more particularly, to a flip chip substrate structure that applies to without plated through hole sand improves circuit integration, and a method to manufacture flip chip substrates with a streamlined process.

2. Description of Related Art

With the development of the IT industry, the research in the industry is gradually turning to multifunctional and high performance electronic products. To meet the demands for high integration and miniaturization of semiconductor packaging, the circuit boards providing circuit connections among active and passive components are evolving from double layer circuit boards to multi-layer circuit boards in order to expand available layout areas on circuit boards within limited spaces by interlayer connection techniques, so as to accommodate high circuit layout density.

The semiconductor packaging structures known in the art are fabricated by adhering a semiconductor chip on the top of the substrate, proceeding with wire bonding or flip chip packaging, and then mounting solder balls on the back of the substrate for electrical connection. Though a high pin quantity can be obtained, operations at higher frequencies or speeds are restricted due to unduly long lead routes and consequent limited performance. Besides, multiple connection interfaces are required in conventional packaging, leading to increased process complexity.

In the method to manufacture flip chip substrates, the fabrication of a substrate begins with a core substrate, which is then subjected to drilling, electroplating, hole-plugging, and circuit formation to accomplish the internal structure. A multi-layer substrate is then obtained through circuit build up processes, as the method to fabricate circuit build up multi-layer circuit boards shown in FIG. 1A to FIG. 1E. Referring to FIG. 1A, a core substrate 11 is first prepared, which is composed of a core layer 111 having a predetermined thickness and circuit layers 112 formed on the surface thereof. Meanwhile, a plurality of plated through hole 113 are formed in the core layer 111 to electrically connect the circuit layers 112. Referring to FIG. 1B, the core substrate 11 is subjected to a circuit build up process so as to overlay a dielectric layer 12 on the surface of the core layer 11, wherein the dielectric layer 12 has a plurality of vias 13 that the circuit layer 112 are exposed to the vias 13. Referring to FIG. 1C, a seed layer 14 is formed by electroless plating or sputtering on the dielectric layer 12, wherein a patterned resist layer 15 is formed on the seed layer 14, and plural openings 150 are formed in the resist layer 15 to expose the portions of seed layer that are set to be a patterned circuit layer. Referring to FIG. 1D, a patterned circuit layer 16 and plural conductive vias 13a are formed in the openings of the resist layer by electroplating, the resist layer 15 and the portions of seed layer 14 covered therebeneath are removed, such that a first circuit build up structure 10a is formed. Referring to FIG. 1E, a second circuit build up structure is formed on the outer surface of the first circuit build up structure in the same manner, repeating the same circuit build up procedures to form a multi-layered substrate.

However, the aforementioned process begins with a core substrate, which is subjected to drilling, electroplating, hole-plugging, and circuit formation to form the internal structure. Then a multi-layer substrate is formed through a circuit build up process. The method has problems such as low integration, multiple layers, long leads and high resistance, rendering it less applicable to high-frequency semiconductor packaging substrates. Due to its multiple layers, the process procedures are complex and the process cost is higher.

SUMMARY OF THE INVENTION

In view of the foregoing disadvantages, the object of the present invention is to provide a method for fabrication of a flip chip substrate structure, which is performed by removing a carrier to increase integration and streamline process procedures.

Another object of the invention is to provide a method for fabrication of a flip chip substrate structure, which reduces the substrate thickness and achieves the purpose of miniaturization.

To achieve the above-mentioned objects, still another object of the present invention is to provide a method for fabrication of a flip chip substrate structure, the steps comprising:

Providing a carrier; forming a resist layer on the carrier, wherein plural first openings are formed in the resist layer. Then sequentially form a first metal layer, an etching-stop layer, and a second metal layer in the first openings of the resist layer. Subsequently, remove the resist layer. Then form a first solder mask on the carrier surface and the second metal layer, wherein plural second openings are formed on the first solder mask and the surface of the second metal layer, which correspond to the second metal mask. Then at least one circuit build up structure is formed on the surface of the first solder mask. Subsequently, form a second solder mask upon the circuit build up structure, wherein plural third openings are formed on the second solder mask to expose the portions of circuits in the circuit build up structure that are to be electrically conductive pads. The carrier, the first metal layer, and the etching-stop layer is then removed, to expose the second metal layer in the second openings of the first solder mask as the electrically conductive pads of the other side. Finally, plural solder bumps are formed on the electrically conductive pads on both sides of the circuit build up structure.

According to the method for fabricating the flip chip substrate structure of the present invention, the etching-stop layer is at least one selected from the group consisting of iron, nickel, chromium, titanium, aluminum, silver, tin, lead, and the alloys thereof. If metals that do not easily oxidize are used for the etching-stop layer, for example, electroless plating gold or electroplating gold, its removal is not needed and can proceed with subsequent process. Further, prior to formation of the metal that does not easily oxidize, i.e. using the electroplating gold as the etching-stop layer, a protection layer can be first formed before formation of the etching-stop layer, removal of electroplating gold is not required, and the subsequent process can be conducted. The material of the protection layer is preferably at least one selected from the group consisting of nickel, chromium, titanium, copper/chromium alloys, and tin/lead alloys. More preferably, it is nickel.

According to the method for fabricating the flip chip substrate of the present invention, metal posts can be firstly formed on the electrically conductive pads on both sides of the circuit build up structure before formation of the solder bumps.

According to the method to fabricate the flip chip substrate of the present invention, further comprising a holding element, which is mounted upon the contour of the second solder mask to prevent the substrate from warping.

According to the method to fabricate the flip chip substrate of the present invention, there is no particular limitation to the material of the carrier, such as ceramics, metal, organic or inorganic materials; preferably it is metal, more preferably copper.

According to the method to fabricate the flip chip substrate of the present invention, there is no particular limitation to the material of the resist layer, but it is preferably photosensitive polymers such as dry-film or liquid photo resist, more preferably dry-film. There is no particular limitation to the method for formation of the first openings, but preferably it is exposure and development.

According to the method to fabricate the flip chip substrate of the present invention, there is no particular limitation to the material of the first solder mask, but it is preferably a photosensitive material. Besides, there is no particular limitation to the method to form the second openings of the first solder mask, but it is preferably by exposure and development.

According to the method to fabricate the flip chip substrate of the present invention, the first metal layer, the etching-stop layer, and the second metal layer are preferably formed by electroplating or electroless plating. The materials of the first metal layer and the second metal layer can be identical or different; preferably at least one selected from the group consisting of copper, nickel, chromium, titanium, copper/chromium alloy, and tin/lead alloys, and more preferably, it is copper.

According to the method to fabricate the flip chip substrate of the present invention, the procedures to form the at least one circuit build up structure comprise:

Forming a dielectric layer on the surfaces of the second metal layer and the first solder mask, and forming plural fourth openings in the dielectric layer, wherein at least one of the fourth openings corresponds to the second metal layer; forming a seed layer on the surfaces of the dielectric layer and the fourth openings; forming a patterned resist layer on the seed layer, and forming plural resist layer openings therein, wherein at least one of the resist layer openings corresponds to the second metal layer; electroplating an electroplating metal layer in the plural resist layer openings; removing the plural resist layers and the seed layer covered therebeneath, such that a desirable multi-layered circuit build up structure is obtained through the above-mentioned steps.

According to the method to fabricate the flip chip substrate of the present invention, the dielectric layer in the aforementioned procedures is at least one selected from the group consisting of photosensitive or non-photosensitive organic resins such as ABF (Ajinomoto Circuit build up Film), BCB (Benzocyclo-buthene), LCP (Liquid Crystal Polymer), PI (Poly-imide), PPE (Poly(phenylene ether)), PTFE (Poly (tetra-fluoroethylene)), FR4, FR5, BT (Bismaleimide Triazine), Aramide, and mixtures of epoxy resins and glass fibers. The seed layer serves as the current conductive routes in the following electroplating process. When it is at least one selected from the group consisting of copper, tin, nickel, chromium, titanium, copper/chromium alloy, and tin/lead alloy, it is formed by the method of sputtering, vapor deposition or electroless plating (or called chemical deposition). When conductive polymers are employed to form the seed layer, the seed layer is formed by spin coating, ink-jet printing, screen printing, or imprinting, wherein the conductive polymers are at least one selected from the group consisting of polyacetylene, polyaniline, and organic sulfur polymers. There is no particular limitation to the electroplating metal layer, preferably it is copper, nickel, chromium, palladium, titanium, tin/lead or the alloys thereof; more preferably, it is copper.

According to the method to fabricate the flip chip substrate of the present invention, there is no particular limitation to the material of the second solder mask, but preferably it is a photosensitive material. There is no particular limitation to the method to form the third openings of the second solder mask, but it is preferably formed by exposure and development.

According to the method to fabricate the flip chip substrate of the present invention, the solder bumps are preferably formed by electroplating or printing. The solder bumps can be at least one selected from the group consisting of copper, tin, lead, silver, nickel, gold, platinum, palladium, and the alloys thereof. According to the aforementioned method to fabricate the flip chip substrate of the present invention, the solder bumps are preferably formed by sputtering, vapor deposition or electroless plating (or called chemical deposition); more preferably, it is formed by electroplating. There is no particular limitation to the material of the metal posts, but preferably it is selected from the group consisting of copper, nickel, chromium, titanium, copper/chromium alloy, and tin/lead alloys. More preferably, it is copper.

DETAILED DESCRIPTION OF THE PREFERRED EMBODIMENT

Example 1

Figure 1A:
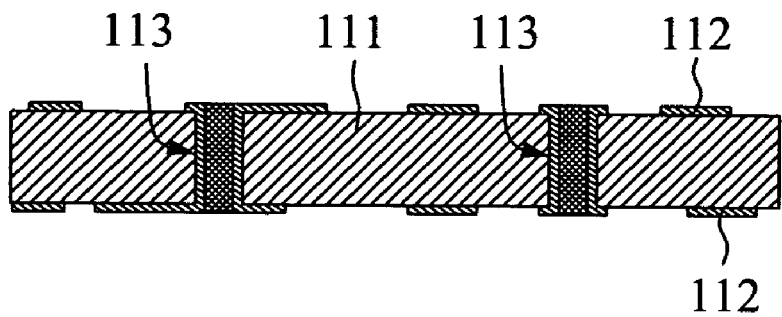
FIG. 1A to 1E is the cross-section of a prior art flip chip substrate having a core layer.
Figure 1B:
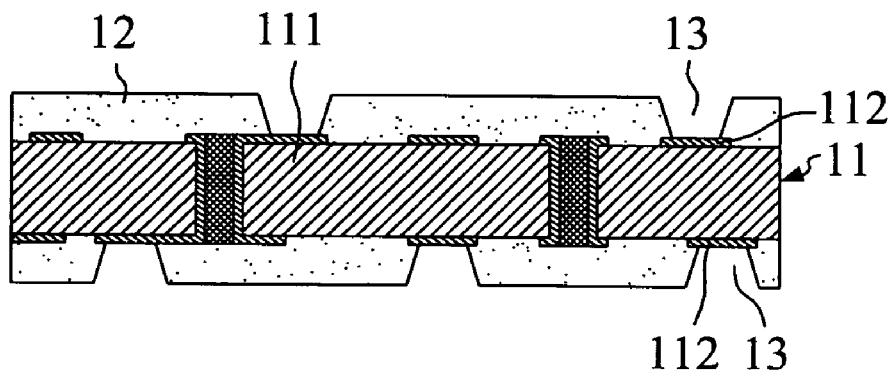
Figure 1C:
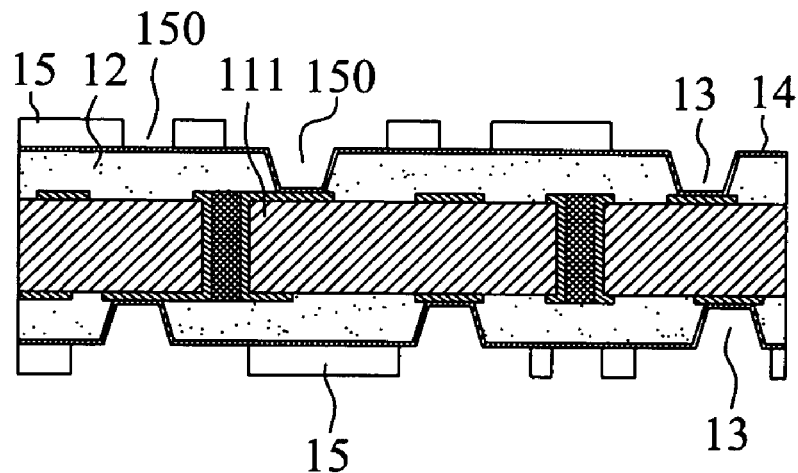
Figure 1D:
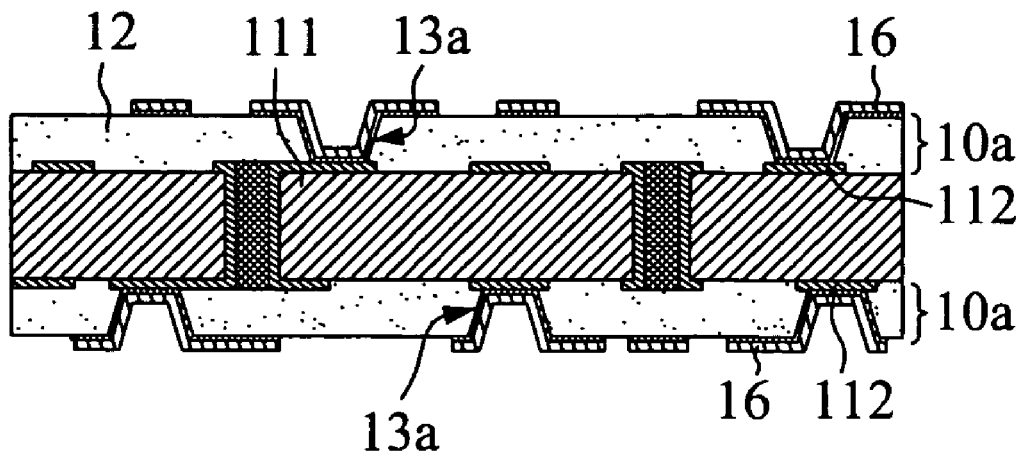
Figure 1E:
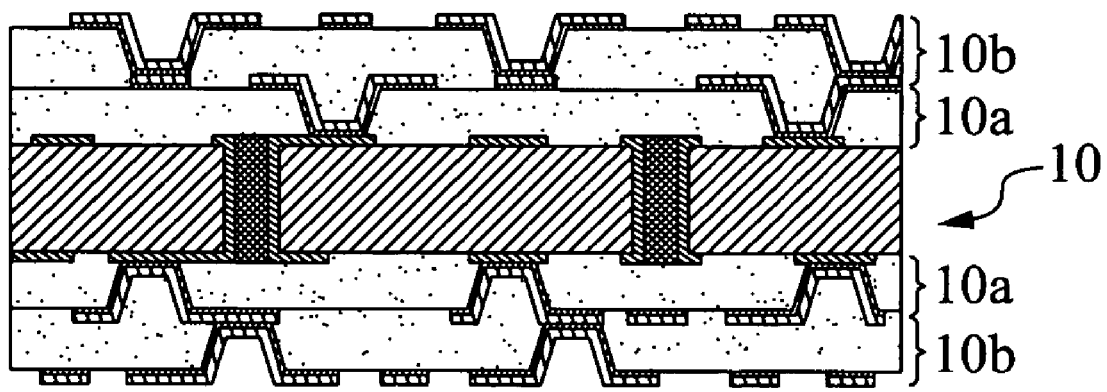
Figure 2A:
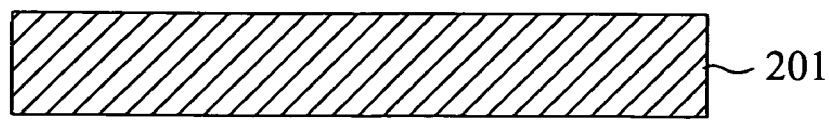
FIG. 2A to 2O' is the cross-section of a flip chip substrate of one preferred embodiment of the present invention.
Figure 2B:
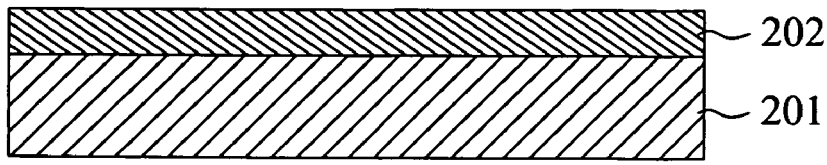
Figure 2C:
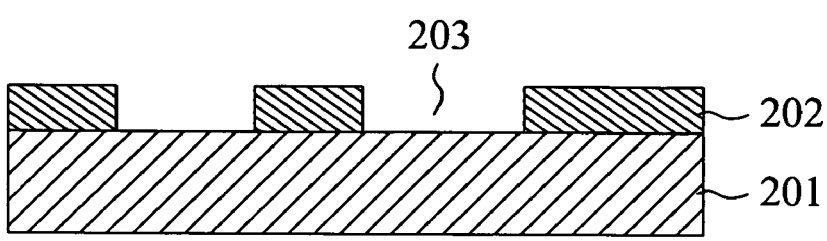
Figure 2D:
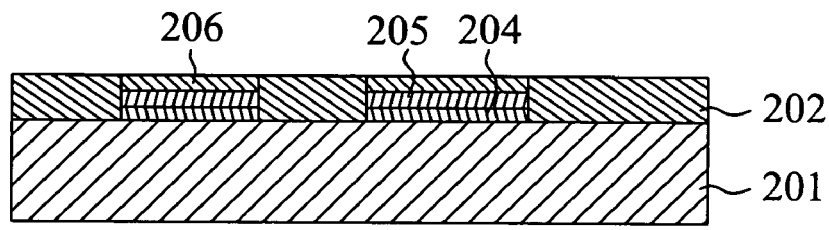
Figure 2E:
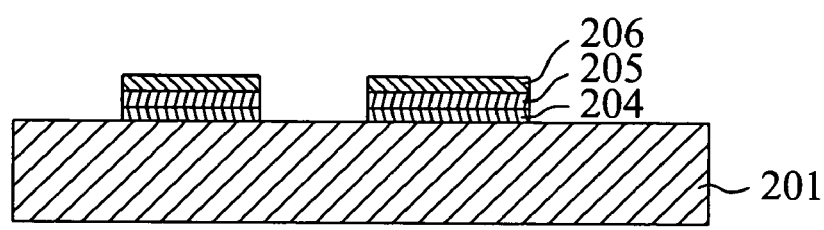
Figure 2F:
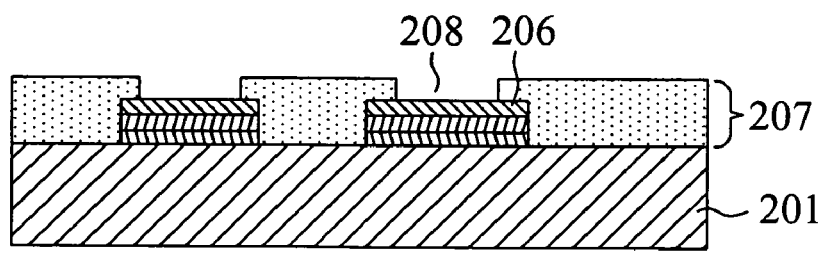
Figure 2G:
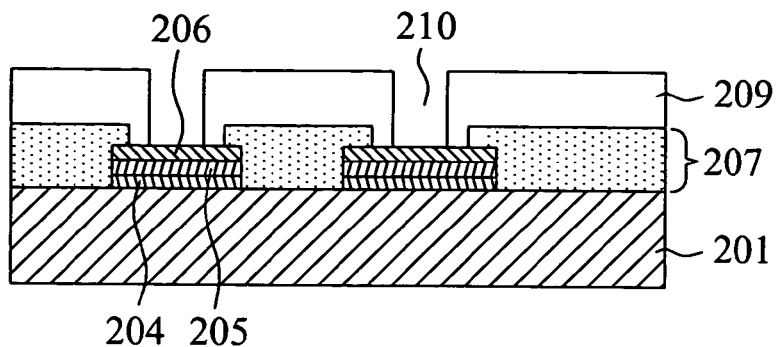
Figure 2H:
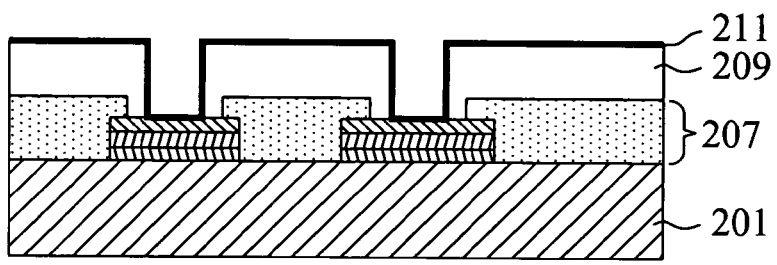
Figure 2I:
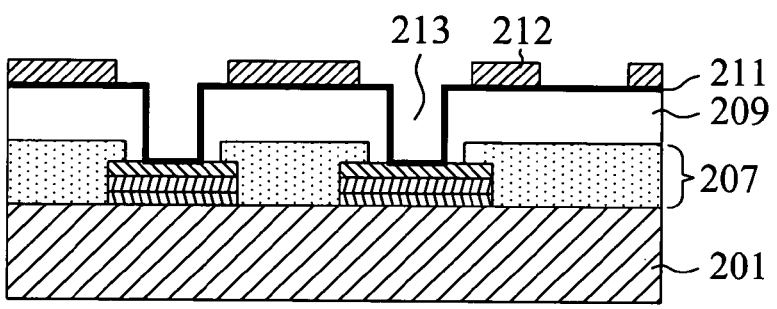
Figure 2J:
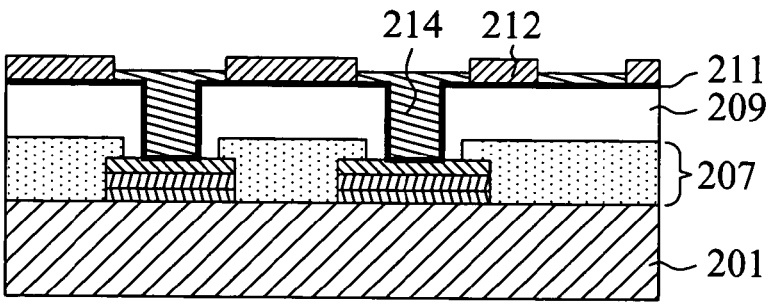
Figure 2K:
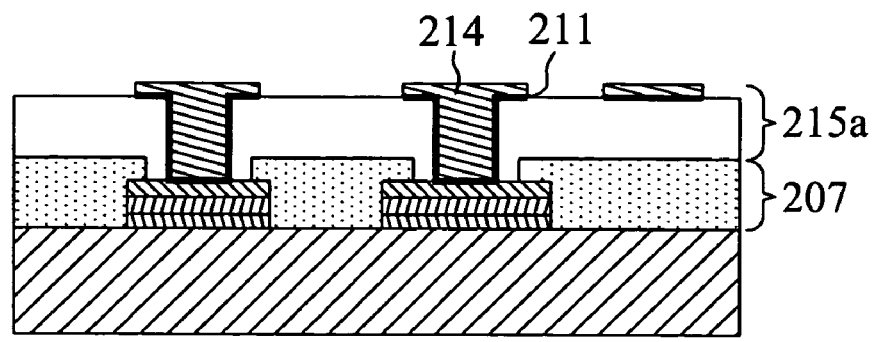
Figure 2L:
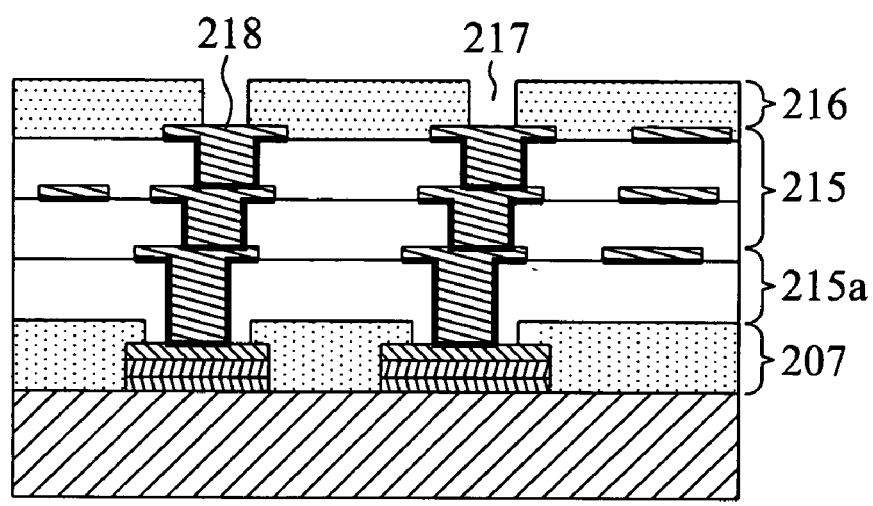
Figure 2M:
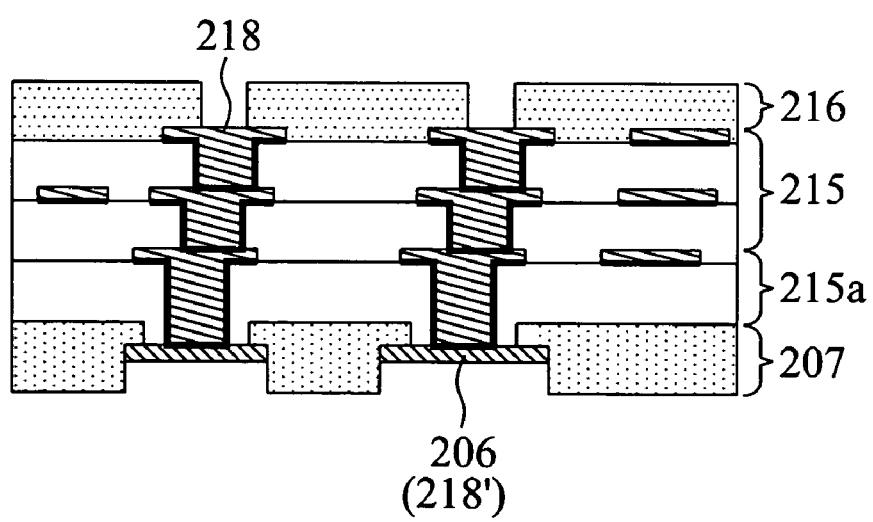
Figure 2N:
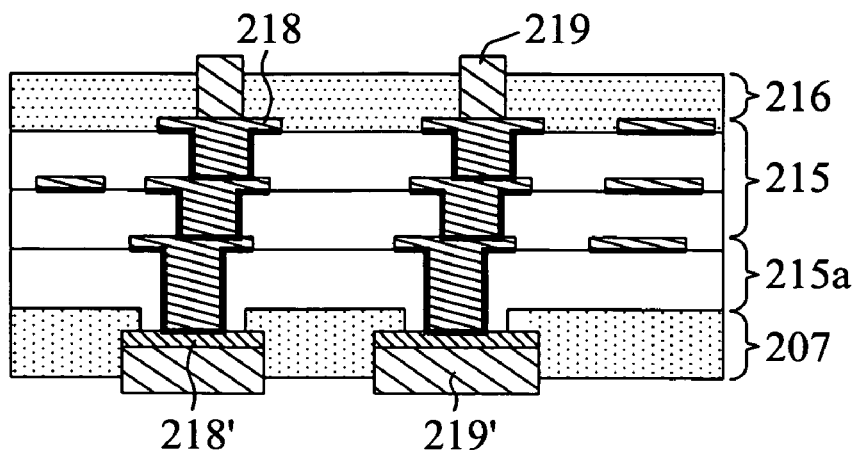
Figure 2O:
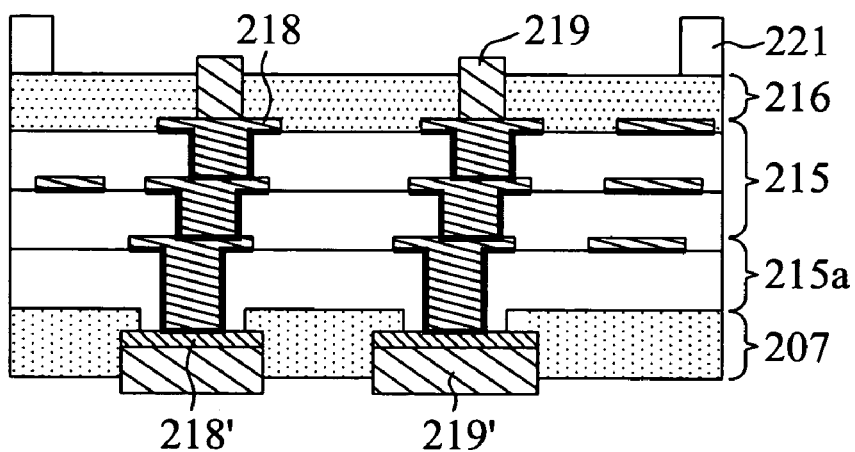
Figure 2N:
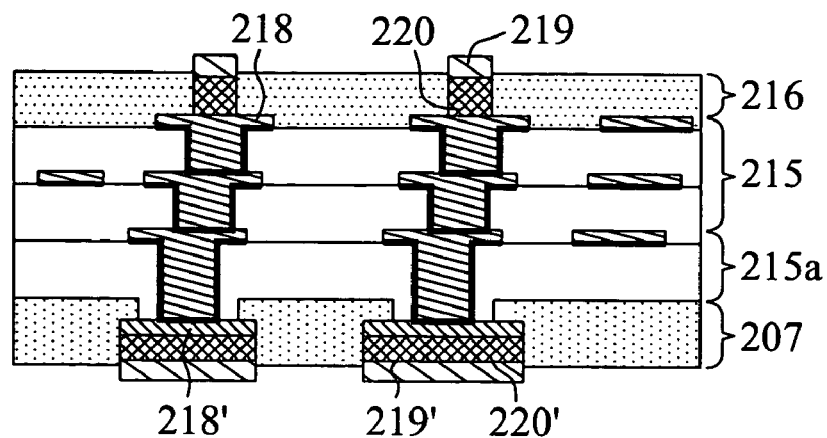
Figure 2O:
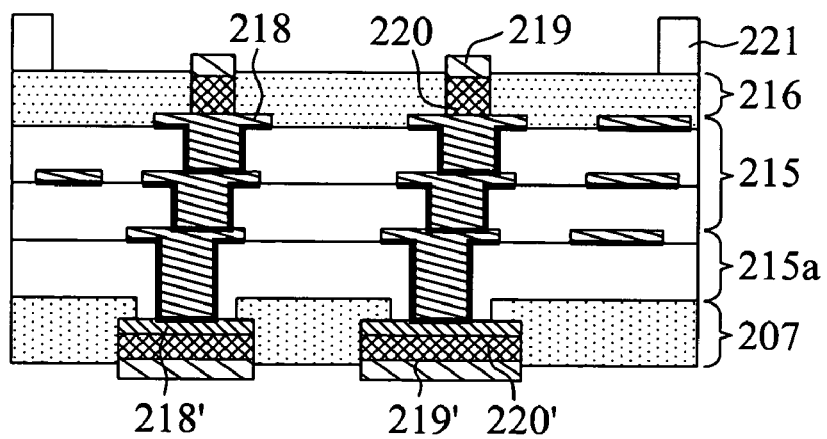

Referring to FIGS. 2A-2O', which illustrate the cross-section of one embodiment of the flip chip substrate structure of the present invention.

First, as shown in FIG. 2A, a carrier 201 is provided, which is a metal plate, preferably a copper plate. Then, as shown in FIG. 2B, a first resist layer 202 is formed on the carrier 201, wherein the material of the resist layer 202 can be a dry-film, and plural first openings 203 are formed in the resist layer 202 by exposure and development, as shown in FIG. 2C.

As shown in FIG. 2D, a first metal layer 204, an etching-stop layer 205 and a second metal layer 206 are formed sequentially by electroplating or electroless plating, wherein the materials of the first metal layer 204 and the second metal layer 206 are copper, and the material of the etching-stop layer 205 is at least one selected from the group consisting of iron, nickel, chromium, titanium, aluminum, silver, tin, lead and the alloys thereof.

Then referring to FIG. 2F, a first solder mask 207 is formed on the surface of the second metal layer 206 and the carrier 201, wherein plural second openings 208 are formed by exposure and development in the first solder mask 207, the plural second openings correspond to the second metal layer 206.

Referring to FIG. 2G, a dielectric layer 209 is laminated on the surfaces of the first solder mask 207 and the second metal layer 206, wherein the dielectric layer 209 is at least one selected from the group consisting of: photo-sensitive and non-photo-sensitive organic resins such as ABF (Ajinomoto Circuit build up Film), BCB (Benzocyclo-buthene), LCP (Liquid Crystal Polymer), PI (Poly-imide), PPE (Poly(phenylene ether)), PTFE (Poly(tetra-fluoroethylene)), FR4, FR5, BT (Bismaleimide Triazine), and Aramide, or mixtures of epoxy resins and glass fibers. Plural fourth openings 210 are formed by means of laser drilling or exposure and development in the dielectric layer 209, wherein at least one of the fourth openings 210 corresponds to the positions of the second metal layer 206. Note that De-smear processes must be performed to remove the smears generated in the fourth openings when laser drilling is employed.

As shown in FIG. 2H, a seed layer 211 is formed on the surface of the dielectric layer 209 and the fourth openings 210, which serves as a current conducting route during electroplating and comprises one selected from the group consisting of copper, tin, nickel, chromium, titanium, copper-chromium alloy, and tin-lead alloy, formed by a approach selected from the group consisting of sputtering, vapor deposition and electroless plating (or called chemical deposition). Besides, the seed layer 211 can comprise conductive polymers, which are one selected from the group consisting of polyacetylene, polyaniline, and organic sulfur polymers, and the seed layer 211 is formed by means of spin coating, ink-jet printing, screen printing, or imprinting.

As shown in FIG. 2I, a patterned resist layer 212 is formed on the seed layer 211, which is used to form plural resist layer openings 213 by exposure and development, wherein at least one resist layer opening 213 corresponds to the positions of the second metal layer 206. Referring to FIG. 2J, the plural resist openings 213 are electroplated with an electroplating metal layer 214, the electroplating metal layer 214 is most preferably copper.

As shown in FIG. 2K, then the resist layer 212 and the seed layer 211 covered therebeneath are removed, and a circuit build up structure 215a is obtained. Referring to FIG. 2L, a multiple-layer circuit build up structure 215 is obtained through the aforementioned procedures, and a second solder mask 216 is coated on the surface of the multiple-layer circuit build up structure 215, and plural third openings 217 are formed by exposure and development in the second solder mask 216 to expose the portions of circuits of the circuit build up structure 215 to be the electrically conductive pads 218.

Then, as shown in FIG. 2M, the carrier 201, the first metal layer 204, and the etching-stop layer 205 are removed by etching to expose the second metal layer 206 that will serve as electrically conductive pads 218' on the other side.

Further referring to FIG. 2N, solder bumps 219 are formed directly on the electrically conductive pads 218 and 218', and the method to form the solder bumps 219 can be electroplating or printing. Alternatively, as shown in FIG. 2N', if needed, metal posts 220 can be formed first by electroplating in the second openings 217 of the second solder mask 216, metal posts 220' can be formed by electroplating under the second metal layer 206, and the material of the metal posts 220 and 220' is copper; then, solder bumps 219' are formed respectively on the metal posts 220 and 220', the method to form the solder bumps 219' can be electroplating or printing, and the material of the solder bumps 219 and 219' is one selected from the group consisting of copper, tin, lead, silver, nickel, gold, platinum, and the alloys thereof.

Finally, as shown in FIGS. 2O and 2O', a holding element 221 is mounted upon the contour of the second solder mask 216, which is used to prevent the substrate from warping.

Example 2

Figure 3A:
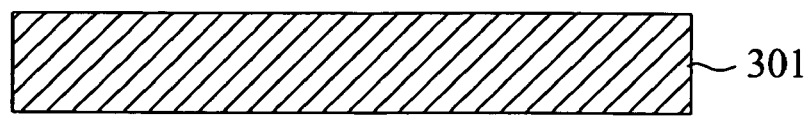
FIG. 3A to 3O' is the cross-section of a flip chip substrate of another preferred embodiment of the present invention.
Figure 3B:
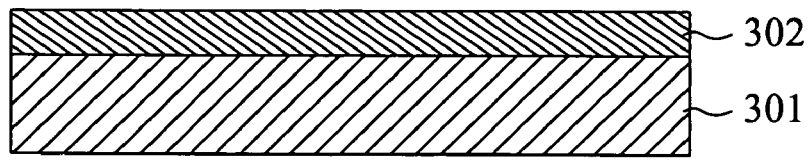
Figure 3C:
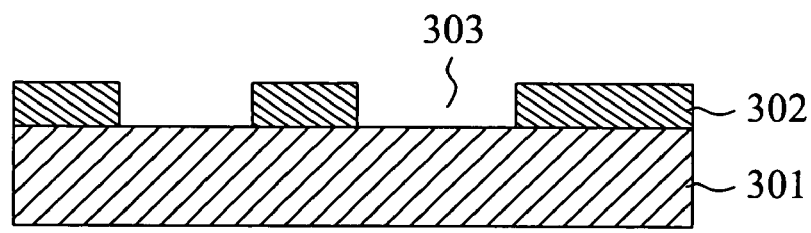
Figure 3D:
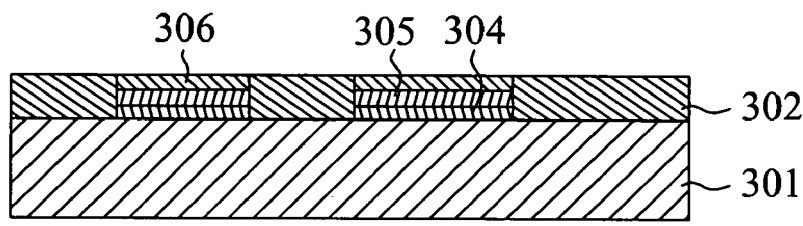
Figure 3E:
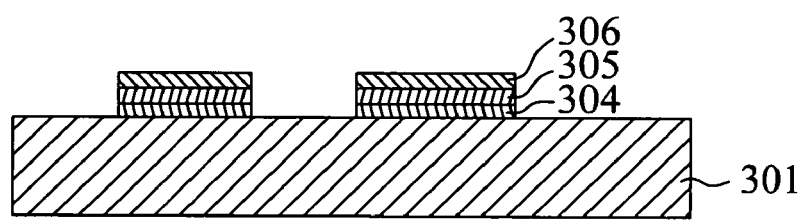
Figure 3F:
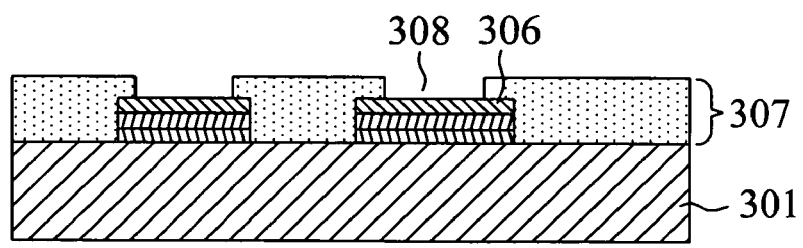
Figure 3G:
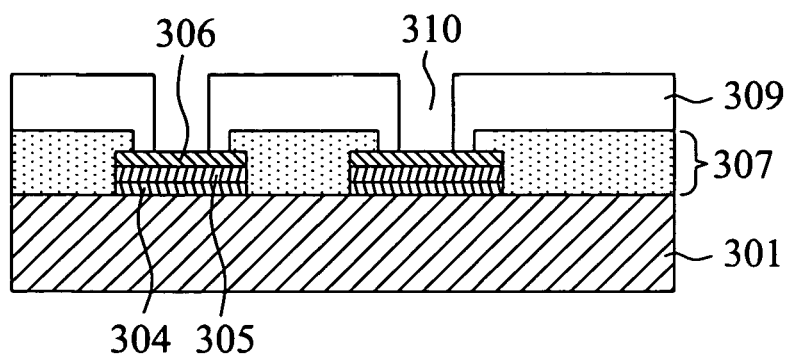
Figure 3H:
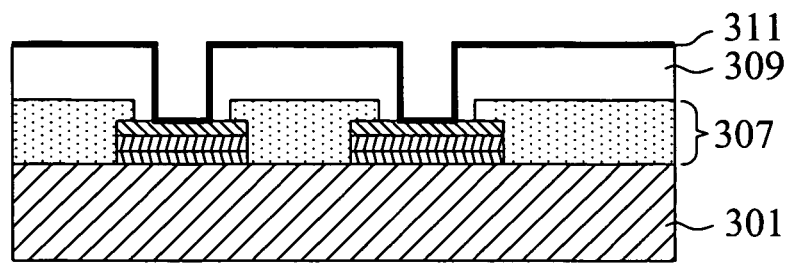
Figure 3I:
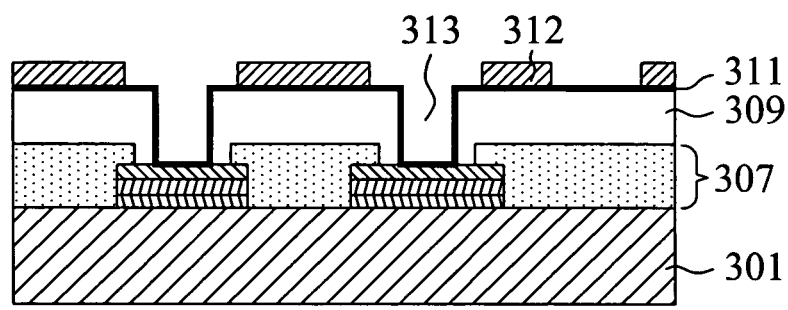
Figure 3J:
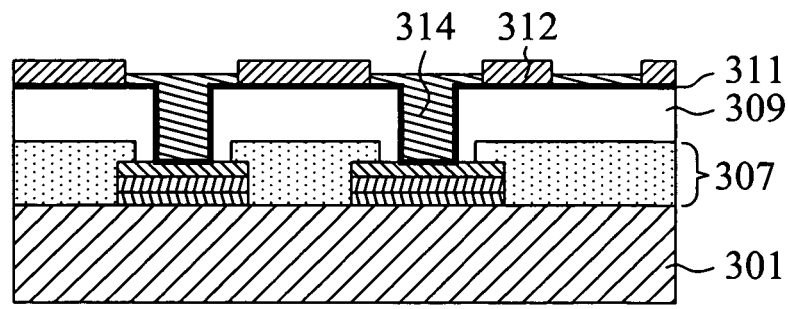
Figure 3K:
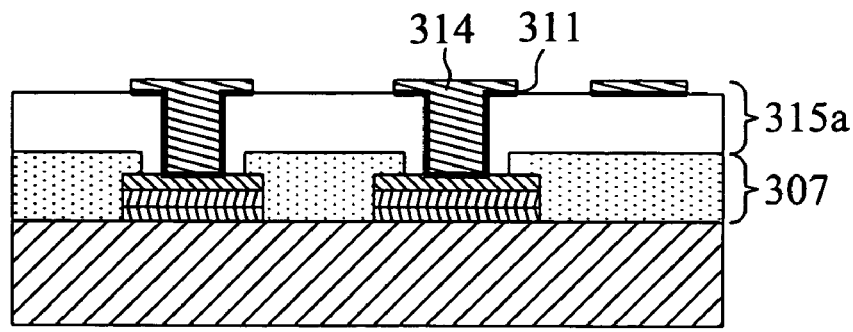
Figure 3L:
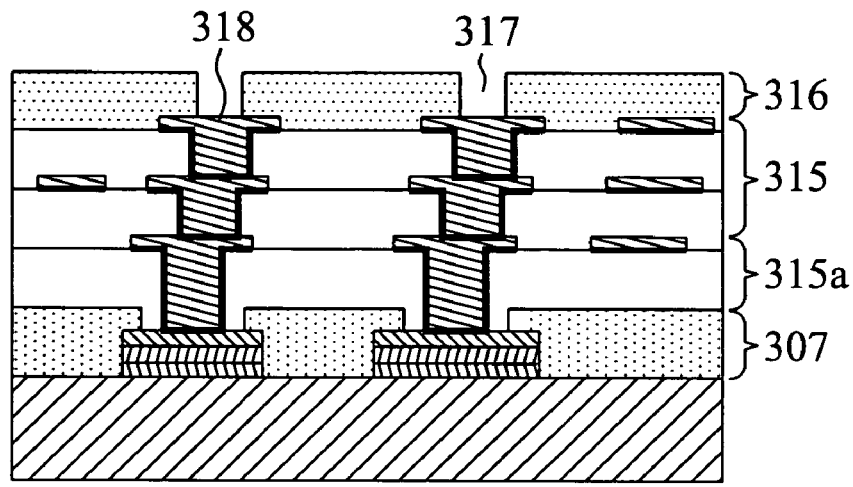
Figure 3M:
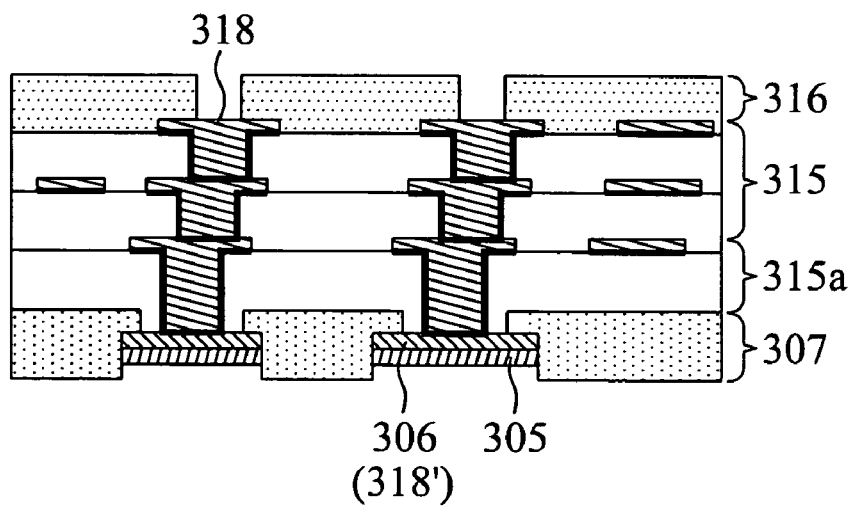
Figure 3N:
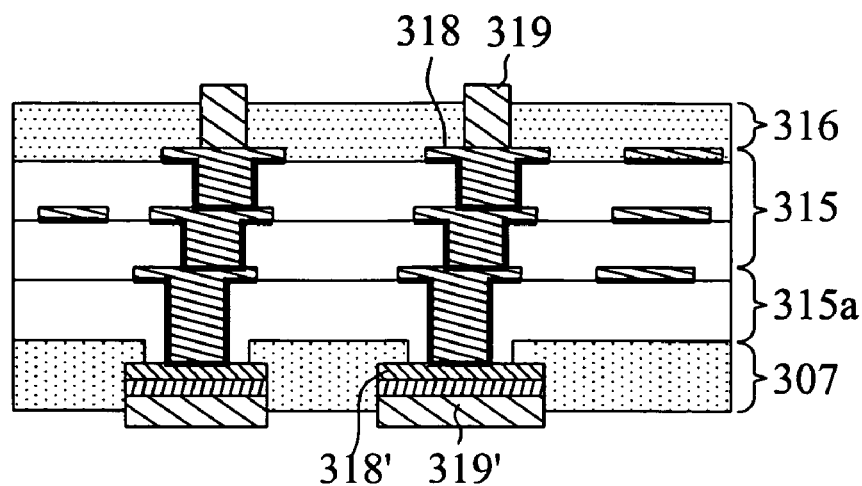
Figure 3O:
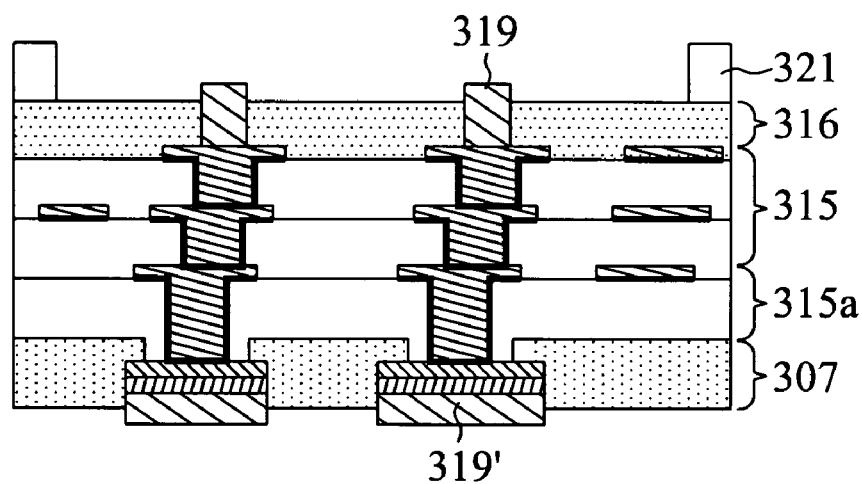
Figure 3N:
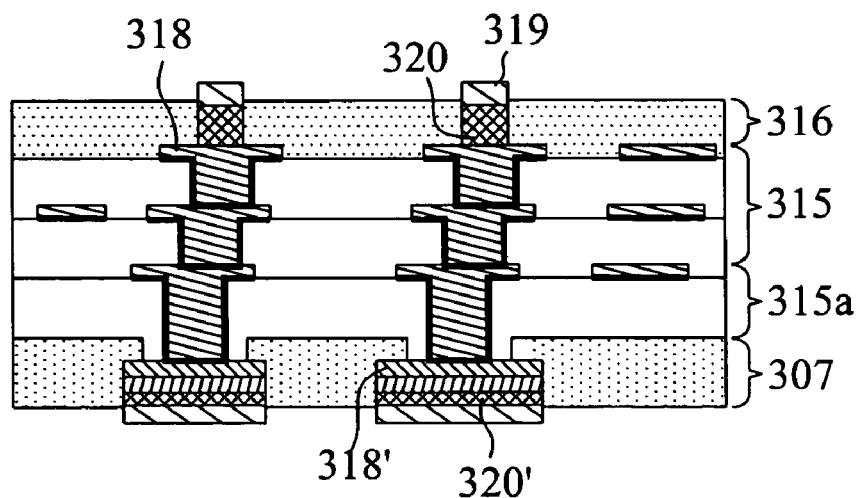
Figure 3O:
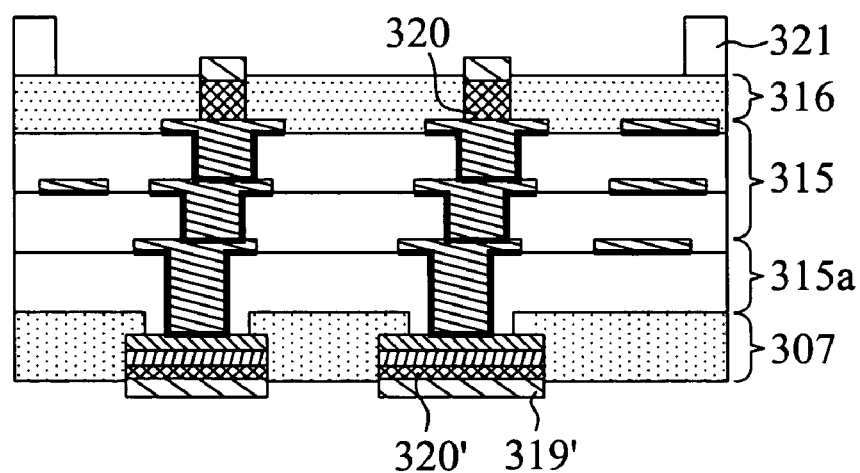

Please refer to FIG. 3A to 3O' to see the cross-section of another embodiment of the flip chip substrate structure of the present invention.

First, as shown in FIG. 3A, a carrier 301 is provided, which is a metal plate, preferably copper. Then, as shown in FIG. 3B, a resist layer 302 is formed on the carrier 301, the material of the resist layer 302 is dry-film, and plural first openings 303 are formed by exposure and development in resist layer 302, as shown in FIG. 3C.

As shown in FIG. 3D, a first metal layer 304, an etching-stop layer 305 and a second metal layer 306 are formed sequentially by electroplating or electroless plating in the first openings 303, wherein the material of the first metal layer 304 and the second metal layer 306 is copper, the material of the etching-stop layer is a metal that does not oxidize easily, most preferably gold, and the method of formation can be electroless plating. Then the resist layer 302 is removed, as shown in FIG. 3E.

Further referring to FIG. 3F, a first solder mask 307 is formed on the carrier 301 and the surface of the second metal layer 306, and plural second openings 308 are formed in the first solder mask 307 by exposure and development, the second openings 308 correspond to the second metal layer 306.

Subsequently, referring to FIG. 3Q a dielectric layer 309 is laminated on surface of the first solder mask 307 and the metal layer 306, the material of the dielectric layer is identical to that of Example 1 and therefore is not set forth herein. Plural fourth openings 310 are formed by means of laser drilling or exposure and development in the dielectric layer 309, wherein at least one of the fourth openings 310 corresponds to the positions of the second metal layer 306. Note that De-smear processes must be performed to remove the smears generated in the fourth openings 310 when laser drilling is employed.

As shown in FIG. 3H, a seed layer 311 is formed on the surface of the dielectric layer 309 and the fourth openings 310, which serves as a current conducting route during electroplating and comprises one metal selected from the group consisting of copper, tin, nickel, chromium, titanium, copper-chromium alloys, and tin-lead alloys, formed by a approach selected from the group consisting of sputtering, vapor deposition, and electroless plating (or called chemical deposition). Besides, the seed layer 311 can comprise conductive polymers, which are one selected from the group consisting of polyacetylene, polyaniline, and organic sulfur polymers, and the seed layer 311 is formed by means of spin coating, ink-jet printing, screen printing, or imprinting.

Subsequently, as shown in FIG. 3I, a patterned resist layer 312 is formed on the seed layer 311, which is used to form plural resist layer openings 313 by exposure and development, wherein at least one resist layer opening 313 corresponds to the positions of the second metal layer 306. Referring to FIG. 3J, the plural resist openings 313 are electroplated with an electroplating metal layer 314, the electroplating metal layer 314 can be copper.

Then as shown in FIG. 3K, the resist layer 312 and the seed layer 311 covered therebeneath are removed, such that a circuit build up structure 315a is obtained. Referring to FIG. 3L, a multi-layered circuit build up structure 315 is obtained, and a second solder mask 316 is coated on the surface of the multi-layered circuit build up structure 315, and plural third openings 317 are formed in the second solder mask 316 by exposure and development to expose the portions of the circuit build up structure 315 circuits that will serve as electrically conductive pads 318.

Then, as shown in FIG. 3M, the carrier 301 and the first metal layer 304 are removed by etching to expose the etching-stop layer 305 that will serve as electrically conductive pads 318' on the other side.

Further referring to FIG. 3N, solder bumps 319 are formed directly on the electrically conductive pads 318 and 318', and the method to form the solder bumps 319 can be electroplating or printing. Alternatively, as shown in FIG. 3N', if needed, metal posts 320 can be formed first by electroplating in the third openings 317 of the second solder mask 316, metal posts 320' are formed on the surface of the etching-stop layer 305, and the material of the metal posts 320 and 320' is copper; then, solder bumps 319' are formed respectively on the metal posts 320 and 320', the method to form the solder bumps 319' can be electroplating or printing, and the material of the solder bumps 319, 319' is one selected from the group consisting of copper, tin, lead, silver, nickel, gold, platinum, and the alloys thereof.

Finally, as shown in FIGS. 3O and 3O', a holding element 321 is mounted upon the contour of the second solder mask 316, which is used to prevent the substrate from warping.

Example 3

Figure 4A:
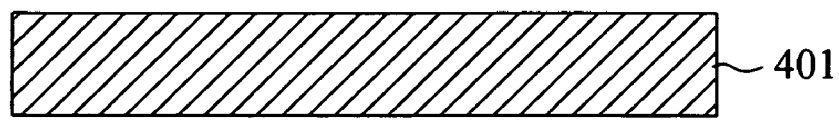
FIG. 4A to 4O' is the cross-section of a flip chip substrate of still another preferred embodiment of the present invention.

Please refer to FIGS. 4A to 4P' to see the cross-section of still another embodiment of the flip chip substrate structure of the present invention.

Figure 4B:
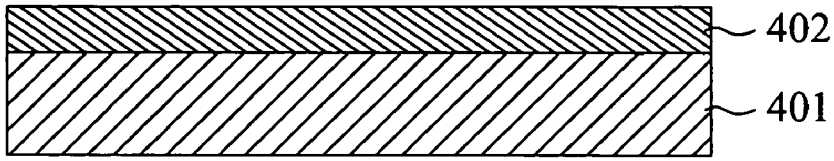
Figure 4C:
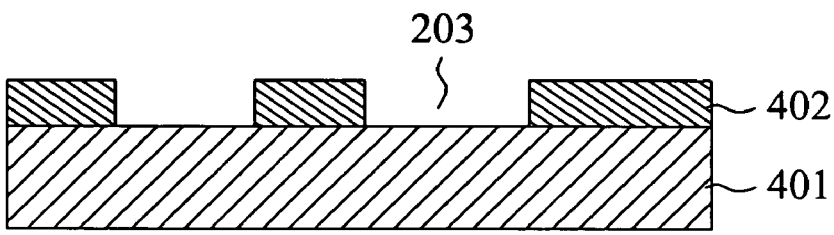

First, as shown in FIG. 4A, a carrier 401 is provided, which is a metal plate, preferably copper. Then, as shown in FIG. 4B, a resist layer 402 is formed on the carrier 401, the material of the resist layer 402 is dry-film, and plural first openings 403 are formed by exposure and development in resist layer 402, as shown in FIG. 4C.

Figure 4D:
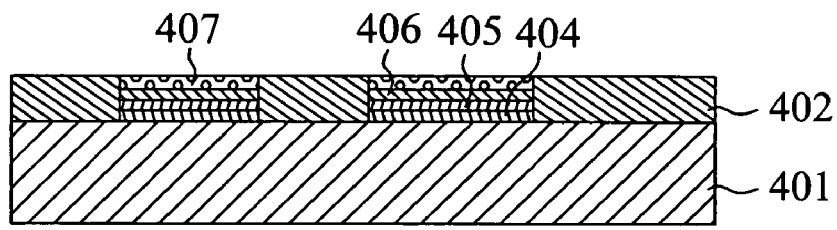
Figure 4E:
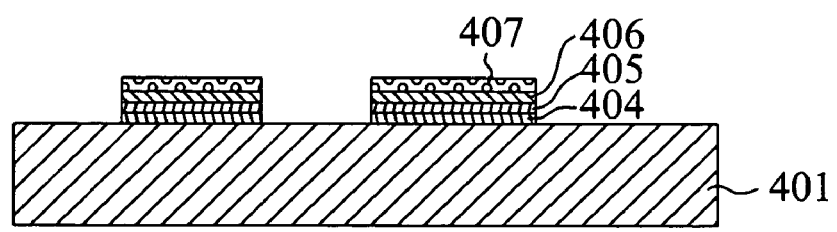

As shown in FIG. 4D, a first metal layer 404, a protection layer 405, an etching-stop layer 406 and a second metal layer 407 are formed sequentially by electroplating or electroless plating in the first openings 403, wherein the material of the first metal layer 404 and the second metal layer 407 is copper, the material of the etching-stop layer is a metal that does not oxidize easily, most preferably gold, and the method of formation can be electroplating. However, copper dissolves in the gold electroplating solution, so nickel must be electroplated as the protection layer 405 to protect copper from dissolving. Then the resist layer 402 is removed, as shown in FIG. 4E.

Figure 4F:
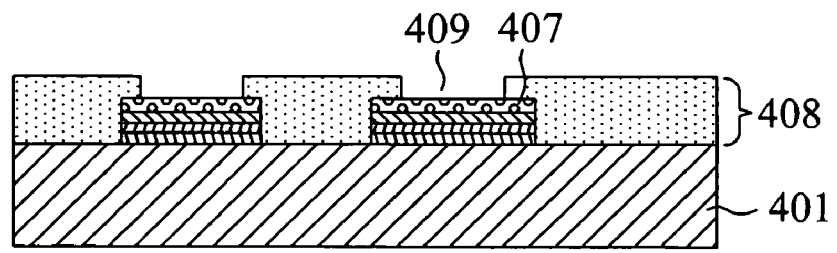

Further referring to FIG. 4F, a first solder mask 408 is formed on the surface of the carrier 401 and the second metal layer 407, and plural second openings 409 are formed in the first solder mask 408 by exposure and development, the second openings 409 correspond to the second metal layer 407.

Figure 4G:
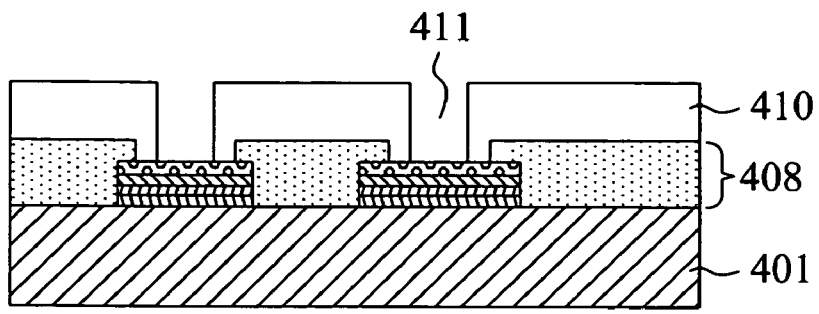

Subsequently, referring to FIG. 4G, a dielectric layer 410 is laminated on the surface of the first solder mask 408 and the second metal layer 407, the material of the dielectric layer is identical to that of Example 1 and therefore is not set forth herein. Plural fourth openings 411 are formed by means of laser drilling or exposure and development in the dielectric layer 410, wherein at least one of the fourth openings 409 corresponds to the positions of the second metal layer 407. Note that De-smear processes must be performed to remove the smears generated in the fourth openings 411 when laser drilling is employed.

Figure 4H:
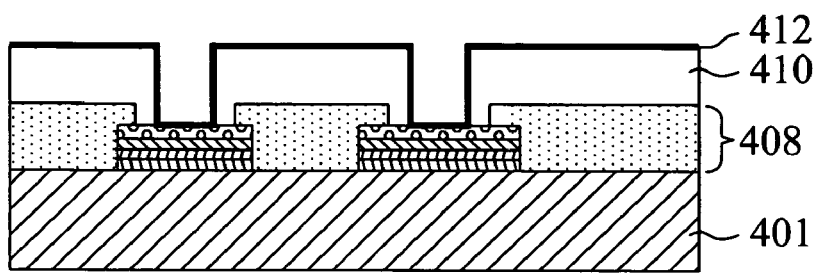

As shown in FIG. 4H, a seed layer 412 is formed on the surface of the dielectric layer 410 and the fourth openings 411, which serves as a current conducting route during electroplating and comprises one metal selected from the group consisting of copper, tin, nickel, chromium, titanium, copper-chromium alloys, and tin-lead alloys, formed by an approach selected from the group consisting of sputtering, vapor deposition and electroless plating (or called chemical deposition). Besides, the seed layer 412 can comprise conductive polymers, which are one selected from the group consisting of polyacetylene, polyaniline, and organic sulfur polymers, and the seed layer 412 is formed by means of spin coating, ink-jet printing, screen printing, or imprinting.

Figure 4I:
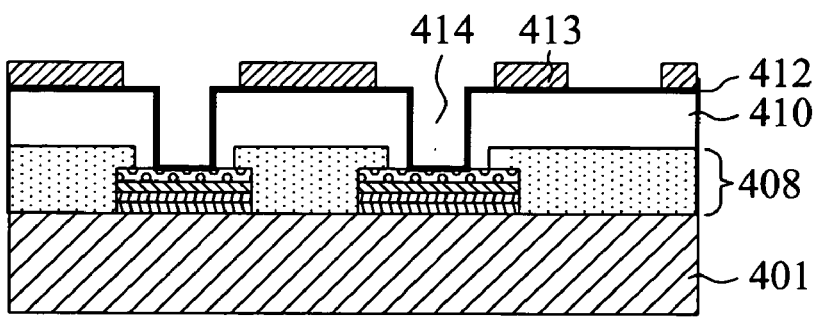
Figure 4J:
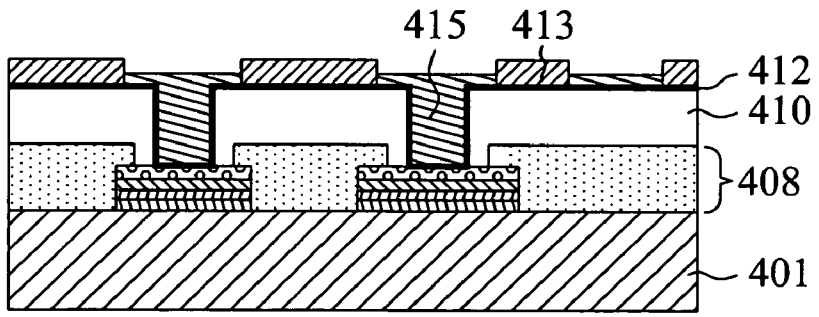

Subsequently, as shown in FIG. 4I, a patterned resist layer 413 is formed on the seed layer 412, which is used to form plural resist layer openings 414 by exposure and development, wherein at least one resist layer opening 414 corresponds to the positions of the metal layer 407. Referring to FIG. 4J, the plural resist openings 414 are electroplated with an electroplating metal layer 415, the electroplating metal layer 415 can be copper.

Figure 4K:
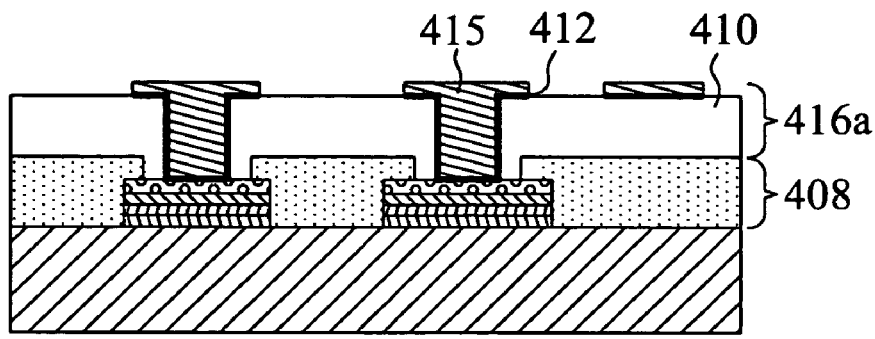
Figure 4L:
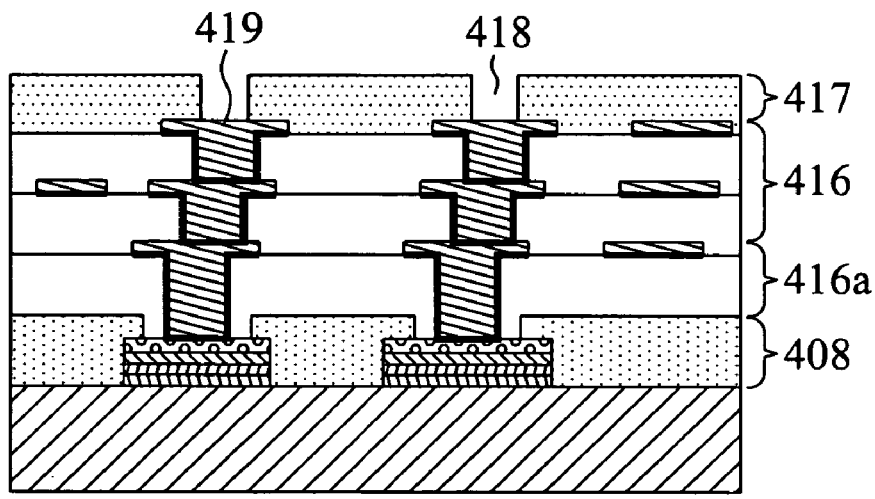

Then as shown in FIG. 4K, the resist layer 413 and the seed layer 412 covered therebeneath are removed, such that a circuit build up structure 416a is obtained. Referring to FIG. 4L, a multi-layered circuit build up structure 416 is obtained, and a second solder mask 417 is coated on the surface of the multi-layered circuit build up structure 416, and plural third openings 418 are formed in the second solder mask 417 by exposure and development to expose the portions of the circuit build up structure 416 circuits that will serve as electrically conductive pads 419.

Figure 4M:
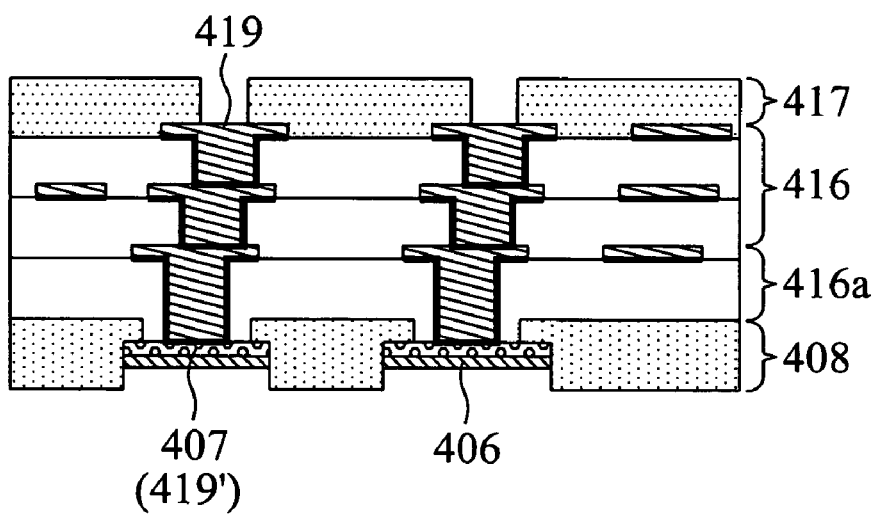

Then, as shown in FIG. 4M, the carrier 401, the first metal layer 404 and the protection layer 405 are removed by etching to expose the etching-stop layer 406 that will serve as electrically conductive pads 419' on the other side.

Figure 4N:
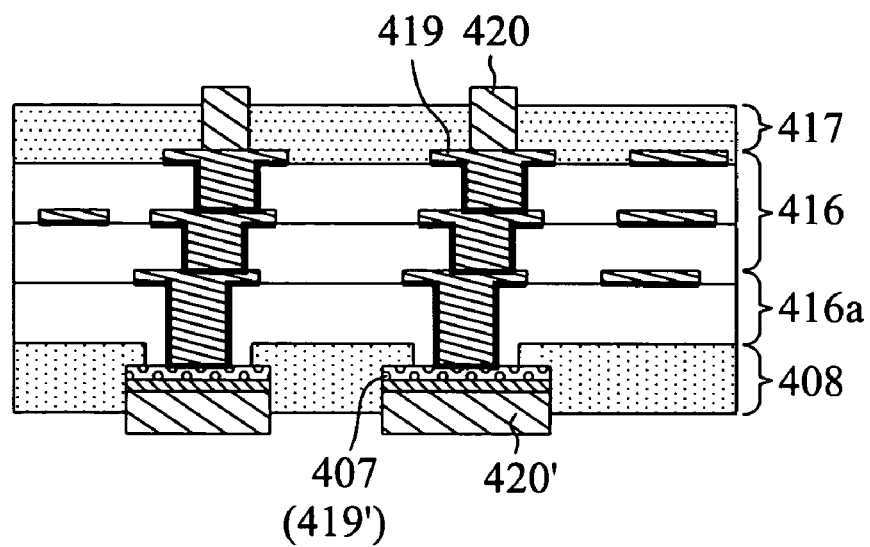

Further referring to FIG. 4N, solder bumps 420 are formed directly on the electrically conductive pads 419 and 419', and the method to form the solder bumps 419 can be electroplating or printing. Alternatively, as shown in FIG. 4N', if needed, metal posts 421 can be formed first by electroplating in the third openings 418 of the second solder mask 417, metal posts 421' are formed on the surface of the etching-stop layer 406, and the material of the metal posts 421 and 421' is copper; then, solder bumps 420' are formed respectively on the metal posts 421 and 421', the method to form the solder bumps 420' can be electroplating or printing, and the material of the solder bumps 420' is one selected from the group consisting of copper, tin, lead, silver, nickel, gold, platinum, and the alloys thereof.

Figure 4O:
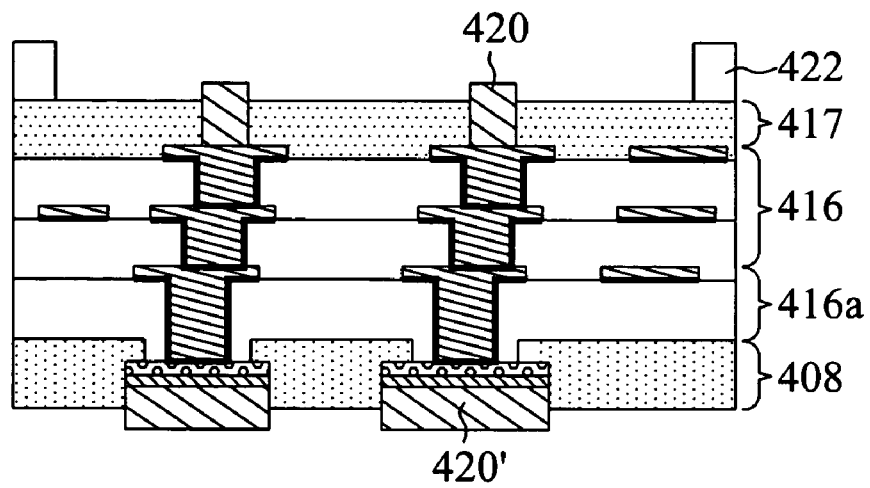
Figure 4N:
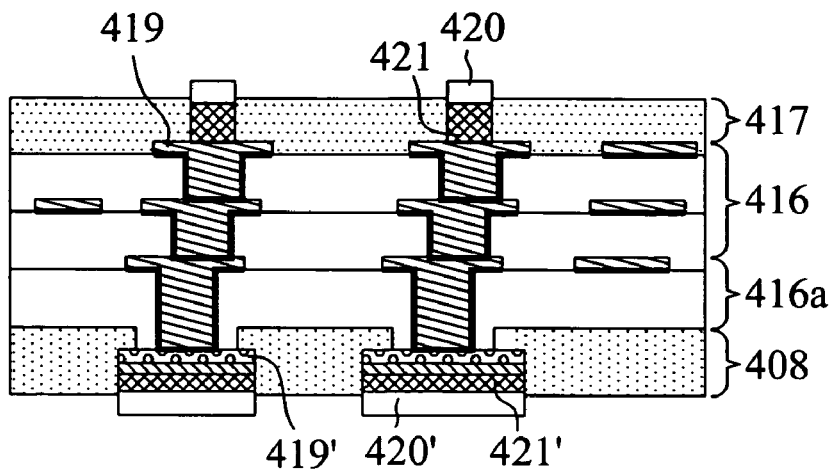
Figure 4O:
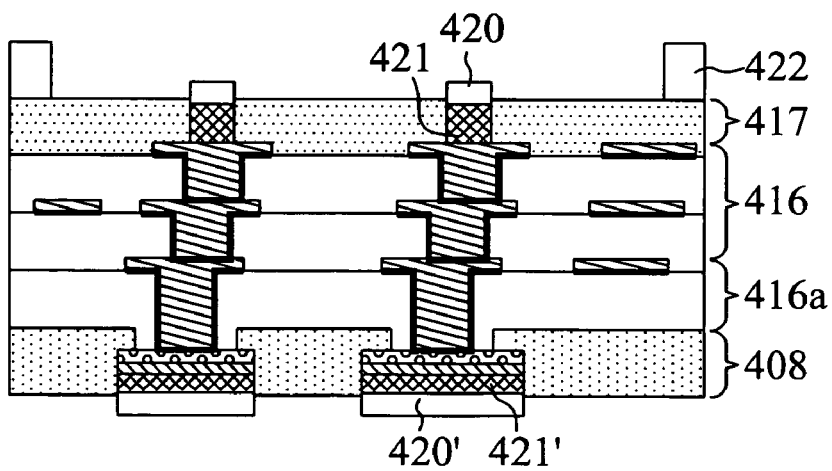

Finally, as shown in FIGS. 4O and 4O', a holding element 422 is mounted upon the contour of the second solder mask 417, which is used to prevent the substrate from warping.

In sum, the present invention solves the problems of low integration, too many layers, long leads and high resistance in packaging substrate having core substrate known in the art. The non-through hole structure increases circuit integration, streamlines the process, reduces thickness and achieves the purpose of miniaturization.

Although the present invention has been explained in relation to its preferred embodiment, it is to be understood that many other possible modifications and variations can be made without departing from the scope of the invention as hereinafter claimed.

What is claimed is:

1. A method for fabricating a flip chip substrate, the steps comprising:
providing a carrier;
forming a resist layer on the carrier, wherein plural first openings are formed in the resist layer;

forming a first metal layer, an etching-stop layer, and a second metal layer in the first openings of the resist layer, sequentially; removing the resist layer;

forming a first solder mask on the carrier surface and the second metal layer;

forming plural second openings in the first solder mask, wherein the second openings correspond to the second metal layer;

forming at least one circuit build up structure on the surface of the first solder mask;

forming a second solder mask upon the circuit build up structure, wherein plural third openings are formed on the second solder mask to expose the portions of circuits in the circuit build up structure that are to be electrically conductive pads; and removing the carrier, the first metal layer, and the etching-stop layer to expose the second metal layer in the second openings of the first solder mask as the electrically conductive pads of the other side.

2. The method of claim 1, wherein plural solder bumps are formed on the electrically conductive pads on both sides of the circuit build up structure.

3. The method of claim 1, wherein the material of the etching-stop layer is at least one selected from the group consisting of iron, nickel, chromium, titanium, aluminum, silver, tin, lead, and the alloys thereof.

4. The method of claim 1, wherein the etching-stop layer is a metal that does not easily oxidize.

5. The method of claim 4, wherein the metal that does not easily oxidize is electroless plating gold.

6. The method of claim 4, wherein the metal that does not easily oxidize is electroplating gold.

7. The method of claim 6, wherein after the first metal layer formed, a protection layer is first formed before formation of the electroplating gold.

8. The method of claim 1, wherein metal posts are first formed on the electrically conductive pads on both sides of the circuit build up structure before formation of the solder bumps.

9. The method of claim 2, further comprises a holding element, which is mounted upon the contour of the second solder mask to prevent the substrate from warping.

10. The method of claim 1, wherein the resist layer is a dry-film.

11. The method to fabricate the flip chip substrate of claim 1, wherein the first openings of the resist layer and the second openings of the first solder mask are formed by exposure and development.

12. The method of claim 1, wherein the first and the second metal layer are formed by electroplating or electroless plating.

13. The method of claim 1, wherein the material of the first metal layer is copper.

14. The method of claim 1, wherein the steps to form the at least one circuit build up structure comprise:

forming a dielectric layer on the surfaces of the second metal layer and the first solder mask, wherein the second openings formed in the first solder mask and plural fourth openings formed in the dielectric layer, and the second openings and the fourth openings corresponds to the second metal layer;

forming a seed layer on the surfaces of the dielectric layer and the fourth openings;

forming a patterned resist layer on the seed layer, and forming plural resist layer openings therein, wherein at least one of the resist layer openings corresponds to the second metal layer; electroplating an electroplating metal layer in the plural resist layer openings; and removing the plural resist layers and the seed layer covered therebeneath.

15. The method of claim 14, wherein the seed layer is at least one selected from the group consisting of copper, tin, nickel, chromium, titanium, copper-chromium alloys, and tin-lead alloys.

16. The method of claim 15, wherein the wherein the seed layer is formed by sputtering, vapor deposition or electroless plating.

17. The method of claim 14, wherein conductive polymers are employed to form the seed layer, and the seed layer is formed by spin coating, ink-jet printing, screen printing, or imprinting.

18. The method of claim 17, wherein the conductive polymers are at least one selected from the group consisting of polyacetylene, polyaniline, and organic sulfur polymers.

19. The method of claim 14, wherein the electroplating metal layer is copper.

20. The method of claim 1, wherein the third openings of the second solder mask is formed by exposure and development.

21. The method of claim 1, wherein the carrier, the first metal layer, and the etching-stop layer are removed by etching.

22. The method of claim 1, wherein the material of the electrically conductive pads on both sides of the circuit build up structure is copper.

23. The method of claim 8, wherein the material of the metal posts is copper.

24. The method of claim 2, wherein the material of the material of the solder bumps is at least one selected from the group consisting of copper, tin, lead, silver, nickel, gold, platinum, palladium, and the alloys thereof.

25. The method of claim 23, wherein the method to form the metal posts is electroplating.

26. The method of claim 24, wherein the method to form the solder bumps is electroplating or printing.

* * * * *